US007180327B2

(12) United States Patent
So et al.

(10) Patent No.: US 7,180,327 B2
(45) Date of Patent: Feb. 20, 2007

(54) MEMORY MODULE SYSTEM WITH EFFICIENT CONTROL OF ON-DIE TERMINATION

(75) Inventors: Byung-Se So, Seongnam-Si (KR); Jeong-Hyeon Cho, Seoul (KR); Jae-Jun Lee, Seongnam-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 10/997,406

(22) Filed: Nov. 24, 2004

(65) Prior Publication Data

US 2005/0212551 A1 Sep. 29, 2005

(30) Foreign Application Priority Data

Mar. 26, 2004 (KR) ...................... 10-2004-0020764

(51) Int. Cl.
*H03K 17/16* (2006.01)
*G11C 8/12* (2006.01)
(52) U.S. Cl. ..................... 326/30; 365/230.03
(58) Field of Classification Search .................. 326/30, 326/82; 365/51, 63, 195, 230.03
See application file for complete search history.

(56) References Cited

U.S. PATENT DOCUMENTS 6,307,791 B1 * 10/2001 Otsuka et al. ......... 365/189.05
6,538,951 B1 3/2003 Janzen et al. .......... 365/230.03

OTHER PUBLICATIONS

Korean Patent Application No. 1020020048708 to Kyung, having Publication date of Apr. 26, 2003 (w/ English Abstract page).
Japanese Patent No. JP2003068082 to Yoshinori, having Publication date of Feb. 27, 2003 (w/ English Abstract page).

* cited by examiner

*Primary Examiner*—Daniel D. Chang
(74) *Attorney, Agent, or Firm*—Monica H. Choi

(57) ABSTRACT

For ODT (on-die termination) control within a memory module system, just one pin from the memory controller is used for sending command signals indicating an activated one of the memory devices. The activated memory device includes components that are turned on for generating the ODT control signal for controlling an ODT circuit of inactivated memory device(s). The components for generating an ODT control signal within the inactivated memory devices are turned off for minimized power consumption.

25 Claims, 8 Drawing Sheets

MEMORY MODULE SYSTEM WITH EFFICIENT CONTROL OF ON-DIE TERMINATION

BACKGROUND OF THE INVENTION

This application claims priority to Korean Patent Application No. 2004-0020764, filed on Mar. 26, 2004, in the Korean Intellectual Property Office, the disclosure of which is incorporated herein in its entirety by reference.

1. Field of the Invention

The present invention relates generally to memory module systems, and more particularly to a memory module system having an activated memory device controlling on-die termination of at least one inactivated memory device for efficient control.

2. Description of the Related Art

Semiconductor devices include receiving circuits for receiving signals via input pads and include output circuits for outputting signals via output pads. Due to high operating speed, the swing width of signals exchanged between semiconductor devices is decreased to minimize delay time of signal transmission.

However with such decreased swing width, influence of external noise increases such that signal reflection from impedance mismatch at an interface point becomes more critical. Such an impedance mismatch degrades high-speed data transmission as output data from an output node of a semiconductor device is distorted. Another semiconductor device receives the distorted output signal with possible setup/hold fail or misjudgment of input level.

Therefore, the semiconductor device at the receiving end includes an impedance matching circuit commonly referred to as "on-die termination" or "on-chip termination" coupled to an input pad. In a general on-die termination scheme, source termination is performed by the output circuit of a first semiconductor device at the transmitting end. Additionally, parallel termination is performed by the receiving circuit of a second semiconductor device at the receiving end.

A point-to-point connection structure is the simplest channel connect structure and is amenable for high-speed data transmission. The point-to-point connection structure typically uses on-die termination (ODT) to improve signal fidelity of channels. Although the point-to-point connection structure provides optimum signal fidelity, a signal line is allocated to each connection such that the point-to-point connection structure may not be amenable for high-bandwidth data transmission.

A memory system requires high bandwidth for high capacity data transmission in addition to high-speed data transmission. Therefore, a memory system implements "ranks" to meet both the requirements. With such ranks, the memory system includes point-to-multipoint connections between a controller and memory devices. However, using a rank selection signal, a point-to-point connection is established for signal transmission between the controller and the memory devices. In such a memory system, ODT is commonly used to improve signal fidelity of channels with each memory device of the memory system including respective ODT therein.

FIG. 1 is a block diagram of a conventional dual rank memory system. Referring to FIG. 1, the dual rank memory system includes first and second memory devices DRAMA and DRAMB each coupled to one signal connection point. A respective ODT circuit is formed within each of the memory devices DRAMA and DRAMB. A first ODT circuit RodtDramA is formed within the first memory device DRAMA, and a second ODT circuit RodtDramB is formed within the second memory device DRAMB.

Table 1 illustrates different methods of controlling activation of the ODT circuits, RodtDramA and RodtDramB, when the first memory device DRAMA is activated for a data read or write.

TABLE 1

| ODT Control Method | RodtDramA | RodtDramB |
|---|---|---|
| Self-On | On | Off |
| Both-On | On | On |
| Other-On | Off | On |

Hereinafter, the activated memory device is the memory device that is selected for data read or write. Any other memory device(s) that is not selected for data read or write is referred to as an inactivated memory device.

In a self-on control method, the respective ODT circuit of the activated memory device is turned "on" while the respective ODT circuit of the inactivated memory device is turned "off." When the first memory device DRAMA is activated, the first ODT circuit RodtDramA is activated while the second ODT circuit RodtDramB of the inactivated second memory device DRAMB is inactivated.

Generally, when an ODT circuit is referred to as being activated (i.e., turned on), the ODT circuit provides a finite resistance at an I/O (input/output) pad of the semiconductor device. When the ODT circuit is referred to as being inactivated (i.e., turned off), the ODT circuit is open-circuited for not affecting the resistance at the I/O (input/output) pad of the semiconductor device.

Further referring to Table 1, in a both-on control method, the ODT circuits of both the activated and inactivated memory devices are turned "on". In the example of the first memory device DRAMA being activated, both the first and second ODT circuits RodtDramA and RodtDramB are activated.

In an other-on control method, the respective ODT circuit of the activated memory device is turned "off", and the respective ODT circuit of the inactivated memory device is turned "on". In the example of the first memory device DRAMA being activated, the first ODT circuit RodtDramA is inactivated while the second ODT circuit RodtDramB of the inactivated second memory device DRAMB is activated.

FIG. 2 illustrates channel characteristic simulation results for such three types of control methods in the dual rank memory system of FIG. 1. Referring to FIG. 2, (a), (b), and (c) illustrate channel characteristic results according to the self-on control method, the both-on control method, and the other-on control method, respectively.

For impedance matching to a channel, Rodt (ODT resistance) is set to be substantially equal to ZO (impedance of a channel) if one DRAM ODT is coupled to the channel. Alternatively, for impedance matching to the channel with two DRAM ODTs being coupled to the channel, Rodt within each DRAM is set to be substantially equal to 2×ZO. However in reality as shown in the simulation result of FIG. 2, best signal fidelity is achieved for the other-on control method due to effects of various parasitic elements in the channel.

Such variance of signal fidelity among the ODT control methods is not significant in conventional memory systems. However, as overall timing budget is decreasing for higher-speed memory systems, variance of signal fidelity among the ODT control methods becomes important. In addition, lower power consumption is becoming important for modern portable applications. Thus, efficient ODT control with high signal fidelity and low power consumption is desired.

SUMMARY OF THE INVENTION

Accordingly, the present invention includes components within memory devices of a memory module system for efficient ODT control.

In a general aspect of the present invention, a memory module system includes an on-die termination (ODT) control signal generator for generating an ODT control signal within a first memory device. In addition, an ODT control signal receiver controls operation of an ODT circuit of a second memory device according to the ODT control signal from the first memory device.

In an example embodiment of the present invention, the ODT control signal from the first memory device activates the ODT circuit of the second memory device when the second memory device is inactivated.

In another embodiment of the present invention, the memory module system further includes a memory controller for generating command signals sent to the first and second memory devices. The ODT control signal generator generates the ODT control signal from the command signals.

In a further embodiment of the present invention, the memory module system includes a first control signal input buffer within the first memory device that is turned on for receiving the command signals when the first memory device is activated. The memory module system also includes a second control signal input buffer within the second memory device that is turned on for receiving the command signals when the second memory device is activated. In that case, one of the first and second control signal input buffers corresponding to an inactivated one of the first and second memory devices is turned off.

In another embodiment of the present invention, the memory module system includes a respective on-die termination (ODT) control signal generator for generating a respective ODT control signal within the second memory device. The memory module system also includes a respective ODT control signal receiver for controlling operation of a respective ODT circuit of the first memory device according to the respective ODT control signal from the second memory device. In that case, a respective ODT control signal generator corresponding to an inactivated one of the first and second memory devices is turned off, and a respective ODT control signal receiver corresponding to an activated one of the first and second memory devices is turned off.

In a further embodiment of the present invention, the memory module system includes a first ODT control signal output buffer that is turned on for sending the respective ODT control signal from the first memory device that is activated to the second memory device that is inactivated. The memory module system also includes a second ODT control signal output buffer that is turned on for sending the second ODT control signal from the second memory device that is activated to the first memory device that is inactivated. In that case, one of the first and second ODT control signal output buffers corresponding to an inactivated one of the first and second memory devices is turned off.

In another embodiment of the present invention, the first and second memory devices are for a same rank of a memory module. Alternatively, the first and second memory devices are for different ranks of a memory module. In addition, the first and second memory devices are for a same memory module or for different memory modules.

In a further embodiment of the present invention, the memory module system includes a plurality of other ODT control signal receivers for controlling operation of a plurality of other ODT circuits of a plurality of other inactivated memory devices according to the ODT control signal from the first memory device that is activated.

In this manner, just one pin from the memory controller is used for sending command signals indicating one of the memory devices that is activated. The activated memory device then includes components that are turned on for generating the ODT control signal for controlling ODT circuits of inactivated memory devices. The components for generating an ODT control signal within the inactivated memory devices are turned off for minimized power consumption.

BRIEF DESCRIPTION OF THE DRAWINGS

The above and other features and advantages of the present invention will become more apparent when described with detailed exemplary embodiments thereof in reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and/or function.

DETAILED DESCRIPTION OF THE INVENTION

Figure 1:
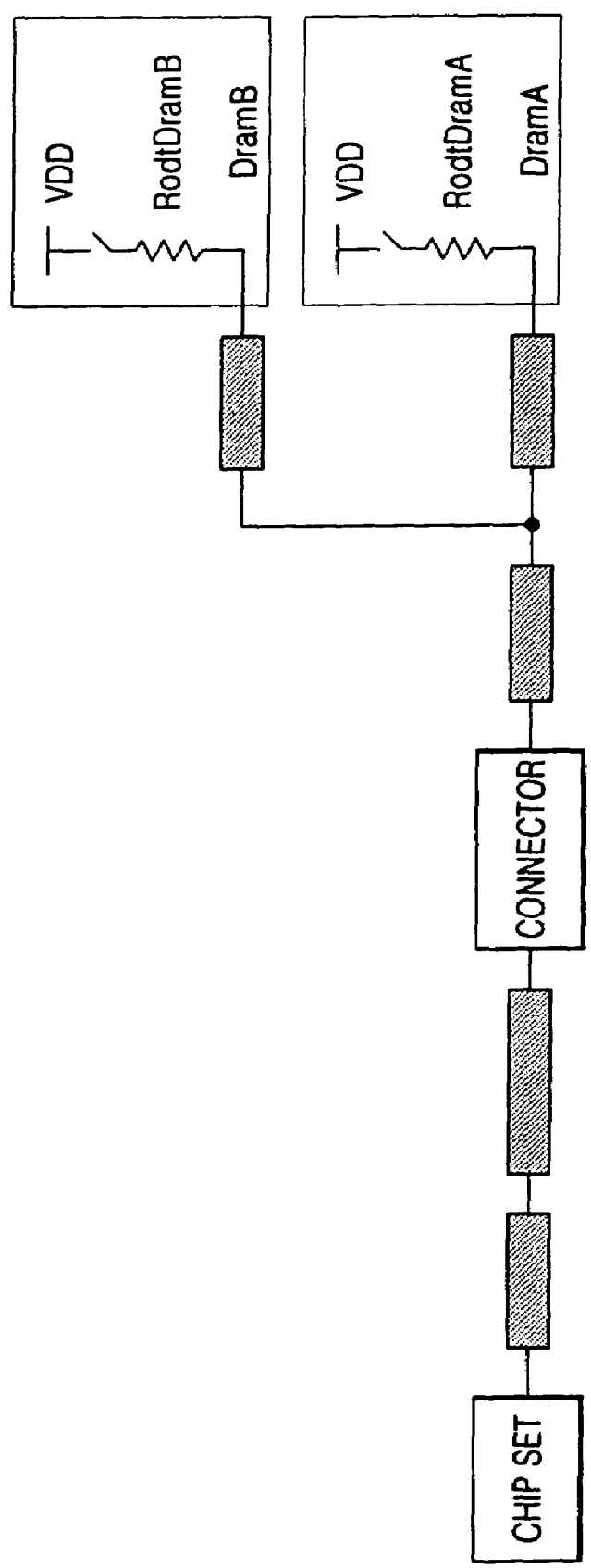
FIG. 1 shows a block diagram of an exemplary conventional dual rank memory system.
Figure 2:
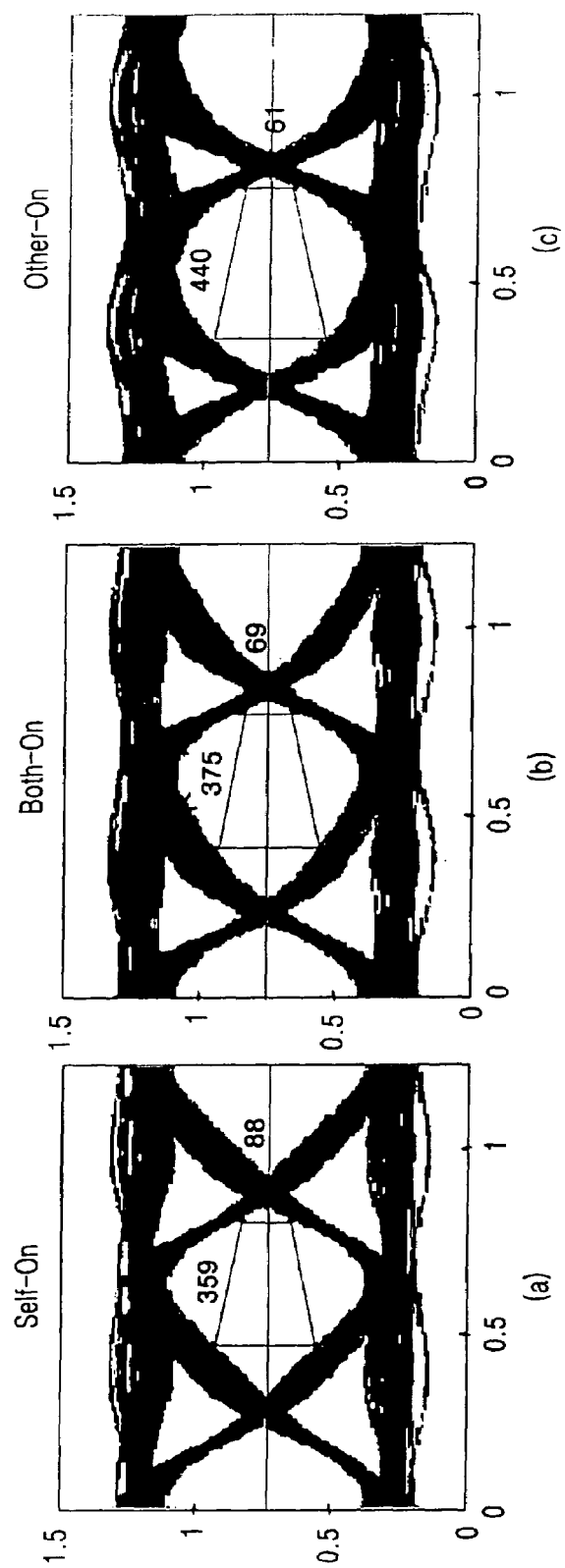
FIG. 2 illustrates channel characteristic simulation results for three types of control methods in the dual rank memory system of FIG. 1.

As shown in FIG. 2, the other-on control method results in the best signal fidelity characteristic in a dual rank memory system. However, with the other-on control method, an additional burden of a separate external resource may be needed for controlling the ODT (on-die termination) of an inactivated memory device. On the other hand for the self-on ODT control method, an internal element within a memory device translates a command for determining whether to activate the ODT within the memory device.

Figure 3:
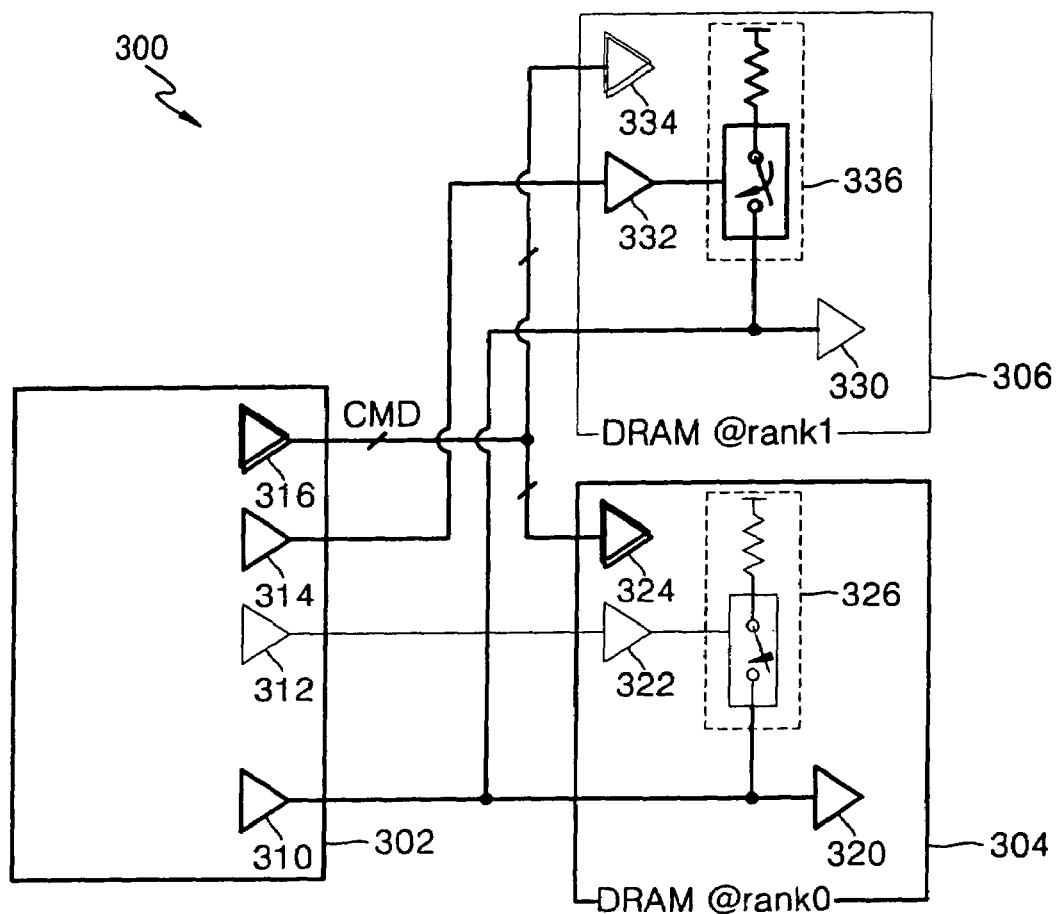
FIG. 3 shows a circuit diagram of a dual rank memory system having a separate resource for conventional on-die termination (ODT) control.

FIG. 3 is a circuit diagram of a dual rank memory system 300 having a separate resource for conventional ODT control. Referring to FIG. 3, the dual rank memory system 300 includes a memory controller 302, a first memory device 304, and a second memory device 306. The memory controller 302 selects one of the first and second memory devices 304 and 306 to be activated for storing/reading data.

The first memory device 304 is for a first rank "rank0", and the second memory device 306 is for a second rank "rank1", of the dual rank memory system. The memory controller 302 includes a data input/output buffer 310 for inputting/outputting data from/to the first and second memory devices 304 and 306. In addition, the memory controller 302 includes a first ODT control signal output buffer 312 that output a first ODT control signal to control a first ODT circuit 326 of the first memory device 304, and includes a second ODT control signal output buffer 314 that outputs a second ODT control signal to control a second ODT circuit 336 of the second memory device 306.

Furthermore, the memory controller 302 includes a data control signal output buffer 316 that outputs a plurality of control commands (CMD). Such control commands may include for example /RAS (row address strobe), /CAS (column address strobe), /CS (column select), and /WE (write enable) signals. In addition, such control commands may also include a memory device selection signal for selecting one of the first and second memory devices 304 and 306 to be activated for storing/reading data.

The first memory device 304 includes a data input/output buffer 320 for inputting/outputting data from/to the memory controller 302. In addition, the first memory device 304 includes a first ODT control signal input buffer 322 for receiving the first ODT control signal, a data control signal input buffer 324 for receiving the plurality of control commands, and the first ODT circuit 326. The first ODT circuit 326 may include a switch controlled according to a termination resistance and the first ODT control signal from the memory controller 302.

The second memory device 306 includes a data input/output buffer 330 for inputting/outputting data from/to the memory controller 302. In addition, the second memory device 306 includes a second ODT control signal input buffer 332 for receiving the second ODT control signal, a data control signal input buffer 334 for receiving the plurality of control commands, and the second ODT circuit 336. The second ODT circuit 336 may include a switch controlled according to a termination resistance and the second ODT control signal from the memory controller 302.

Each of the memory devices 304 and 306 has a respective separate pin (not shown) for controlling the respective ODT circuit 326 and 336. Thus, the memory controller 302 includes a plurality of control pins (not shown), each coupled to a respective one of the memory devices 304 and 306 for controlling the ODT circuits 326 and 336.

The ODT circuits 326 and 336 are controlled by separate communication with the memory controller 302 through separate ODT control signal lines connected to the memory devices 304 and 306. With such an ODT control structure, ODT control for each of the memory devices 304 and 306 is carried out independently. Therefore, the self-on, the both-on, and the other-on control methods of Table 1 and FIG. 2 may all be readily performed.

For example for the other-on control method with optimum signal fidelity, a control signal for activating the ODT circuit of an inactivated memory device is simply sent from the memory controller 302. However, the memory controller 302 of FIG. 3 sends a respective ODT control signal with a respective control circuit and a respective pin from the memory controller 302 to each of the memory devices 304 and 306. Such a memory system 300 of FIG. 3 has a burdensome resource requirement for each memory device including a separate signal line connected to a mother board and a separate pin of a socket or a connecter. In addition, the memory devices also require additional pins for receiving the ODT control signals. Such resources become seriously burdensome as the number of ranks increases.

Figure 4:
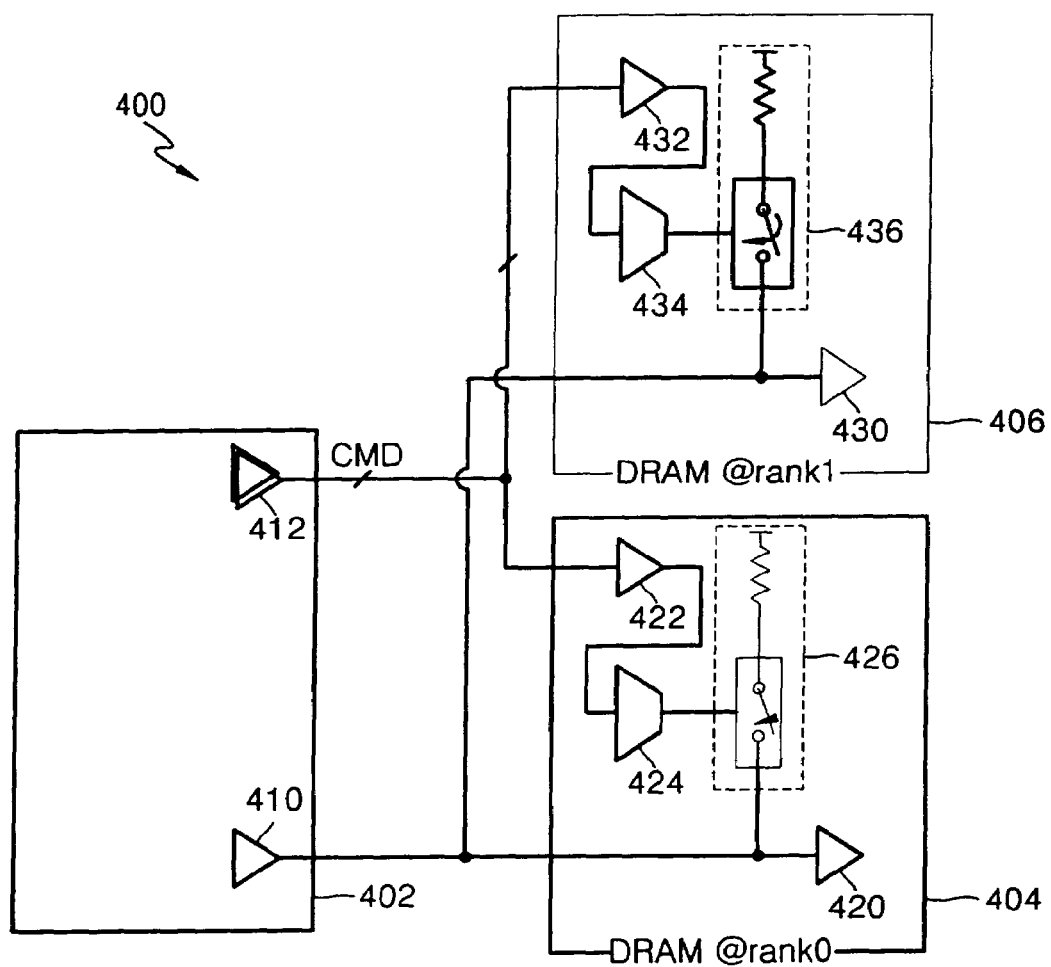
FIG. 4 shows a circuit diagram of a dual rank memory system without a separate resource for conventional ODT control.

FIG. 4 shows a circuit diagram of a dual rank memory system without a separate resource for conventional ODT control. Referring to FIG. 4, a dual memory rank system 400 includes a memory controller 402, a first memory device 404, and a second memory device 406.

The memory controller 402 includes a data input/output buffer 410 for inputting/outputting data from/to the first and second memory devices 404 and 406. The memory controller 402 also includes a data control signal output buffer 412 that outputs a plurality of control commands (CMD). Such control commands may include for example /RAS (row address strobe), /CAS (column address strobe), /CS (column select), and /WE (write enable) signals. In addition, such control commands may also include a memory device selection signal for selecting one of the first and second memory devices 404 and 406 to be activated for storing/reading data.

The first memory device 404 includes a data input/output buffer 420 for inputting/outputting data from/to the memory controller 402. The first memory device 404 also includes a data control signal input buffer 422 for receiving the plurality of control commands from the memory controller 402. The first memory device 404 also includes a first ODT control signal generator 424 for translating the control commands from the data control signal input buffer 422 to generate an ODT control signal. A first ODT circuit 426 of the first memory device 404 is controlled by the ODT control signal. The first ODT circuit 426 may include a switch controlled according to a termination resistance and the ODT control signal.

The second memory device 406 includes a data input/output buffer 430 for inputting/outputting data from/to the memory controller 402. The second memory device 406 also includes a data control signal input buffer 432 for receiving the plurality of control commands from the memory controller 402. The second memory device 406 also includes a second ODT control signal generator 434 for translating the control commands from the data control signal input buffer 432 to generate an ODT control signal. A second ODT circuit 436 of the second memory device 406 is controlled by the ODT control signal. The second ODT circuit 436 may include a switch controlled according to a termination resistance and the ODT control signal.

Separate pins (for the first and second ODT control signal output buffers 312 and 314 of FIG. 3) for inputting/outputting the ODT control signals are not used in FIG. 4. Instead, the dual rank memory system 400 of FIG. 4 controls the ODT circuits 426 and 436 by using command snooping which interprets the command signals transmitted from the memory controller 402.

The example of activating the first memory device 404 for storing/reading data therein is now described with reference to FIG. 4. The memory controller 402 outputs the plurality of commands (CMD) to the memory devices 404 and 406 for indicating that the first memory device 404 is activated. Assume that the dual rank memory system 400 controls the ODT circuits 426 and 436 according to the other-on method.

In that case, the data control signal input buffer 432 of the second memory device 406 receives the commands (CMD) while turned "on" and outputs the command signals to the ODT control signal generator 434. The ODT control signal generator 434 interprets the command signals to generate the ODT control signal that activates the ODT circuit 436 of the second memory device 406.

In this manner in FIG. 4, the command signals (CMD) are sent to both of the memory devices 404 and 406 that individually interpret the command signals to generate the ODT control signal. Therefore, the dual rank memory system 400 does not have the disadvantage of having a separate resource within the memory controller 402.

Rather, for activating the ODT circuit of the inactivated memory device, the inactivated memory device also receives the command signals (CMD). Thus, the data control signal input buffer 432 and the ODT control signal generator 434 of the inactivated memory device stay "on" with stand-by currents disadvantageously resulting in power consumption.

Figure 5:
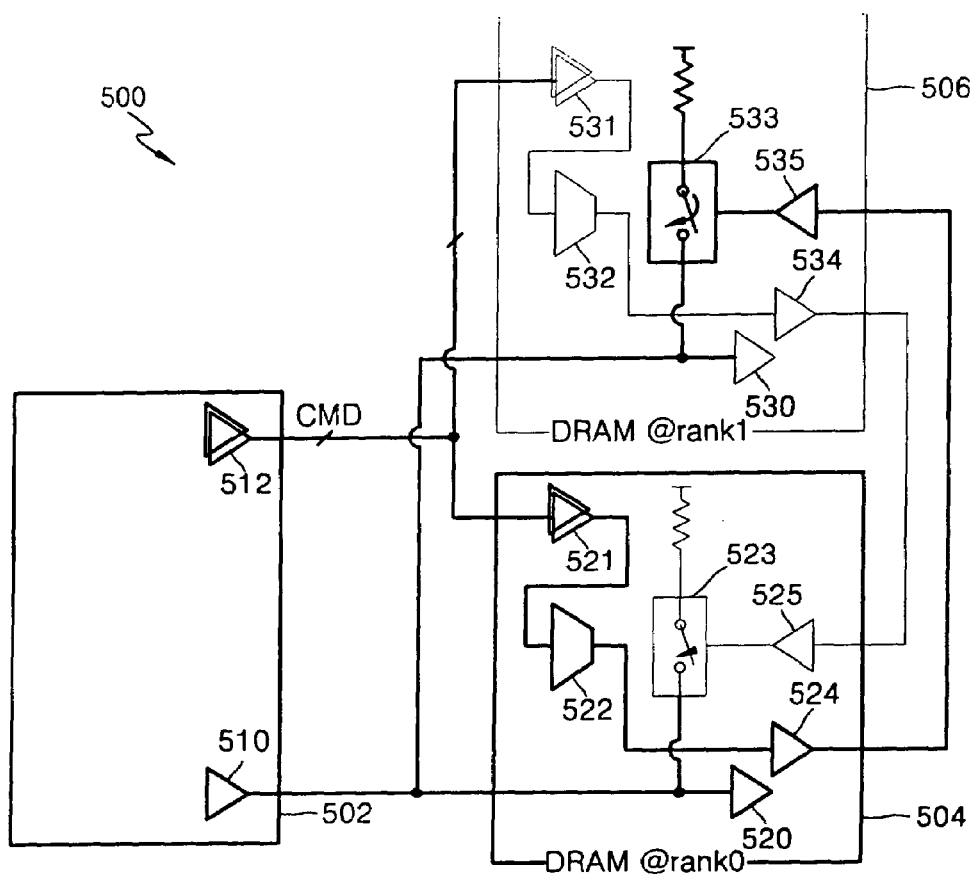
FIG. 5 shows a circuit diagram of a memory module system with ODT control according to an embodiment of the present invention.

FIG. 5 is a circuit diagram of a memory module system 500 illustrating ODT (on-die termination) control according to an embodiment of the present invention. The memory module system 500 illustrates a dual rank memory system with first and second ranks, rank0 and rank1, as an example.

Referring to FIG. 5, the memory module system 500 includes a memory controller 502, a first memory device 504, and a second memory device 506. The first memory device 504 is for a first rank, rank0, and the second memory device 506 is for a second rank, rank1.

The memory controller 502 includes a data input/output buffer 510 for inputting/outputting data from/to the first and second memory devices 504 and 506. The memory controller 502 also includes a data control signal output buffer 512 for outputting a plurality of control commands (CMD) to the memory devices 504 and 506. Such control commands may include for example /RAS (row address strobe), /CAS (column address strobe), /CS (column select), and /WE (write enable) signals. In addition, such control commands may also include a memory device selection signal for selecting one of the first and second memory devices 504 and 506 to be activated for storing/reading data.

The first memory device 504 includes a data input/output buffer 520 for inputting/outputting data from/to the memory controller 502. The first memory device 504 also includes a data control signal input buffer 521, an ODT control signal generator 522, an ODT circuit 523, an ODT control signal output buffer 524, and an ODT control signal input buffer (i.e., an ODT control signal receiver) 525.

The data control signal input buffer 521 receives the plurality of commands (CMD) from the memory controller 502. The ODT control signal generator 522 interprets the command signals from the data control signal input buffer 521 to generate an ODT control signal.

The ODT circuit 523, coupled to a data input/output line, prevents signal reflection by impedance matching. The ODT circuit 523 of the first memory device 504 is controlled by the ODT control signal received from the second memory device 506 via the ODT control signal input buffer 525.

When first memory device 504 is activated and the second memory device 506 is inactivated, the ODT control signal output buffer 524 outputs the ODT control signal generated by the ODT control signal generator 522 to an ODT control signal input buffer (i.e., an ODT control signal receiver) 535 of the second memory device 506. When the second memory device 506 is activated and the first memory device 504 is inactivated, the ODT control signal input buffer 525 receives the ODT control signal from the ODT control signal output buffer 543 of the second memory device 506 for controlling the ODT circuit 523.

The second memory device 506 includes a data input/output buffer 530 for inputting/outputting data from/to the memory controller 502. The second memory device 506 also includes a data control signal input buffer 331, an ODT control signal generator 532, an ODT circuit 533, an ODT control signal output buffer 534, and an ODT control signal input buffer 535.

The data control signal input buffer 531 receives the plurality of commands (CMD) from the memory controller 502. The ODT control signal generator 532 interprets the commands from the data control signal input buffer 531 to generate an ODT control signal.

The ODT circuit 533, coupled to a data input/output line, prevents signal reflection by impedance matching. The ODT circuit 533 is controlled by the ODT control signal from the first memory device 504 via the ODT control signal input buffer 535.

When the first memory device 504 is inactivated, the ODT control signal output buffer 534 outputs the ODT control signal generated by the ODT control signal generator 532 to the ODT control signal input buffer 525 of the first memory device 504. When the first memory device 504 is activated and the second memory device 506 is inactivated, the ODT control signal input buffer 535 receives the ODT control signal from the ODT control signal output buffer 524 of the first memory device 504 for controlling the ODT circuit 533.

In this manner, the ODT control signal of the inactivated memory device is generated by the activated memory device and transmitted to the inactivated memory device for controlling the ODT circuit of the inactivated memory device. Thus, the data control signal input buffer 521 or 531 and the ODT control signal generator 522 or 532 of the inactivated memory device is turned off for minimized power-consumption.

FIG. 5 illustrates an example of the first memory device 504 being selected to be activated for storing/reading data therein with the second memory device 506 being inactivated. In FIG. 5, components marked with thick lines are activated parts (i.e., turned on), and components marked with thin lines are inactivated (i.e., turned off).

The memory controller 502 sends the command signals (CMD) to the first memory device 504 via the data control signal output buffer 512. The data control signal input buffer 521 of the first memory device 504 receives the command signal and is activated. The first memory device 504 is also activated for inputting/outputting data from/to the data input/output buffer 510 of the memory controller 502 via the data input/output buffer 520 of the first memory device 504.

In addition, the ODT control signal generator 522 interprets the command signals from the data control signal input buffer 521 to generate the ODT control signal. The ODT control signal output buffer 524 sends the ODT control signal from the first memory device 504 to the ODT control signal input buffer 535 of the second memory device 506. The ODT control signal input buffer 535 receives the ODT control signal from the first memory device 504 for activating the ODT circuit 533 of the second memory device 506.

Thus, when the second memory device 506 is inactivated, the ODT circuit 533 of the second memory device 506 is turned on for on-die termination in the other-on ODT control method. In this manner, the second memory device 506 has minimized power consumption with just the ODT control signal input buffer 535 being turned on for activating the ODT circuit 533 while the rest of the components of the second memory device 506 are turned off.

In addition, the ODT control signal input buffer 525 or 535 may be implemented to be smaller than the data input/output buffers 510 and 530 or the data control signal input buffers 521 and 531. For example, an inverter-type input buffer may be used for the ODT control signal input buffer 535 instead of a differential amplifier type input buffer for even less power consumption.

With the memory module system 500, on-die termination of other types of methods aside from just the other-on method may readily be performed. In addition, operation of the memory module system 500 for the case of the second memory device 506 being activated and the first memory device 504 being inactivated would be readily apparent to one of ordinary skill in the art from the description herein with the turning on or off of the components within the memory devices 504 and 506 being reversed.

Figure 6:
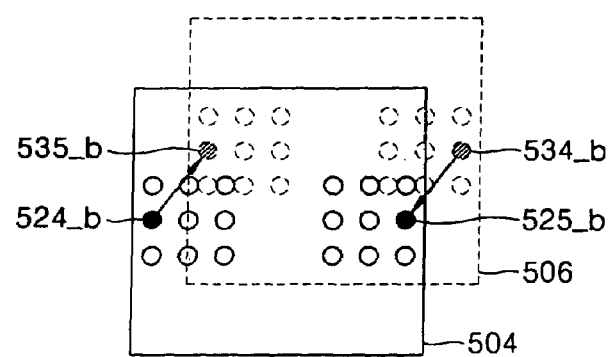
FIG. 6 shows an exemplary arrangement of contact balls of memory devices for the memory module system of FIG. 5, according to an embodiment of the present invention.

FIG. 6 shows an exemplary arrangement of contact balls of the memory devices 504 and 506 of the memory module system 500 of FIG. 5. FIG. 6 illustrates an example in which substrates of the first and second memory devices 504 and 506 face each other. Here, a contact ball 524_b connected to the ODT control signal output buffer 524 of the first memory device 504 faces a contact ball 535_b connected to the ODT control signal input buffer 535 of the second memory device 506. In addition, a contact ball 525_b connected to the ODT control signal input buffer 525 of the first memory device 504 faces a contact ball 534_b connected to the ODT control signal output buffer 534 of the second memory device 506. Referring to FIGS. 5 and 6, the contact balls 524_b and 535_b facing each other are connected together to form a first signal line. In addition, the contact balls 525_b and 534_b facing each other are connected together to form second signal line.

With such close proximity between such balls, signal distortion is minimized with low communication distance and time of the ODT control signals. Accordingly, the ODT control signal input buffers 525 and 535 and the ODT control signal output buffers 524 and 534 may be designed with relative simplicity for minimized power consumption for turning "on" the ODT control signal input buffers 525 and 535 and the ODT control signal output buffers 524 and 534.

Figure 7:
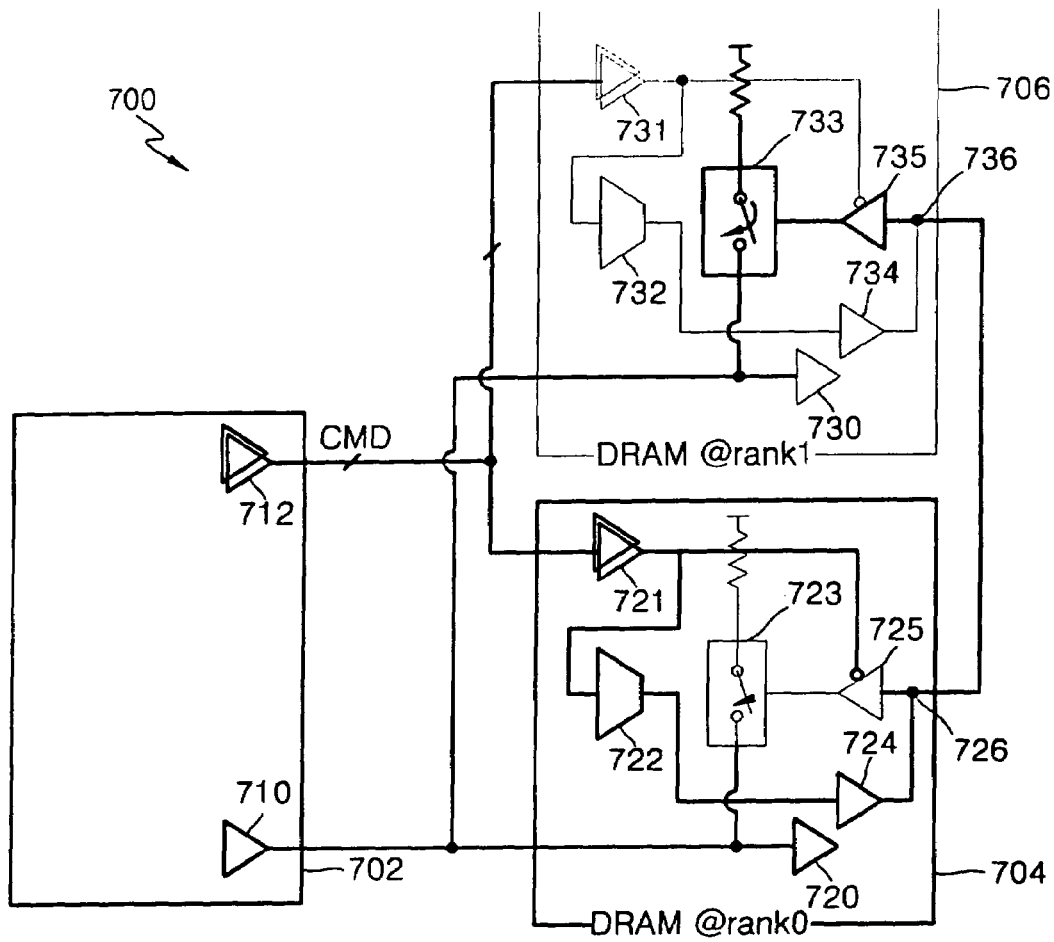
FIG. 7 shows a circuit diagram of a memory module system with ODT control according to another embodiment of the present invention.

FIG. 7 shows a circuit diagram of a memory module system 700 with ODT control according to another embodiment of the present invention. The memory module system 700 is a dual rank memory system similar to the memory module system 500 of FIG. 5. Referring to FIG. 7, the memory module system 700 includes a memory controller 702, a first memory device 704, and a second memory device 706.

The memory controller 702 includes a data input/output buffer 710 for inputting/outputting data from/to the first and second memory devices 704 and 706. The memory controller 702 also includes a data control signal output buffer 712 for outputting a plurality of control commands (CMD) to the first and second memory devices 704 and 706. Such control commands may include for example /RAS (row address strobe), /CAS (column address strobe), /CS (column select), and /WE (write enable) signals. In addition, such control commands may also include a memory device selection signal for selecting one of the first and second memory devices 704 and 706 to be activated for storing/reading data.

The first memory device 704 includes a data input/output buffer 720 for inputting/outputting data from/to the memory controller 702. The first memory device 704 also includes a data control signal input buffer 721, an ODT control signal generator 722, an ODT circuit 723, an ODT control signal output buffer 724, and an ODT control signal input buffer (i.e., an ODT control signal receiver) 725.

The data control signal input buffer 721 receives the plurality of commands from the memory controller 702. The ODT control signal generator 722 interprets the commands from the data control signal input buffer 721 to generate an ODT control signal. The ODT circuit 723, coupled to a data input/output line, prevents signal reflection by impedance matching in response to an ODT control signal received from the second memory device 706 via the ODT control signal input buffer 725.

When the first memory device 704 is activated and the second memory device 706 is inactivated, the ODT control signal output buffer 724 outputs the ODT control signal from the ODT control signal generator 722 to an ODT control signal input buffer (i.e., an ODT control signal receiver) 735 of the second memory device 706. In addition in that case, the ODT control signal input buffer 725 responds to an output signal from the data control signal input buffer 721 by being turned "off."

On the other hand, when the first memory device 704 is inactivated and the second memory device 706 is activated, the ODT control signal input buffer 725 receives an ODT control signal output from the ODT control signal output buffer 734 of the second memory device 706 for controlling the ODT circuit 723 to be turned on. The ODT control signal input and output buffers 725 and 724 of the first memory device 704 are connected at a common node 726 that is coupled to the second memory device 706 via common a ball and pin (not shown).

The second memory device 706 includes a data input/output buffer 730 for inputting/outputting data from/to the memory controller 702. The second memory device 706 also includes a data control signal input buffer 731, an ODT control signal generator 732, an ODT circuit 733, an ODT control signal output buffer 734, and an ODT control signal input buffer 735.

The data control signal input buffer 731 receives the plurality of commands (CMD) from the memory controller 702. The ODT control signal generator 732 interprets the commands from the data control signal input buffer 731 to generate an ODT control signal. The ODT circuit 733, coupled to a data input/output line, prevents signal reflection by impedance matching in response to the ODT control signal received from the first memory device 704 via the ODT control signal input buffer 735.

When the first memory device 704 is inactivated and the second memory device 706 is activated, the ODT control signal output buffer 734 outputs the ODT control signal generated by the ODT control signal generator 732 to the ODT control signal input buffer 725 of the first memory device 704. Also in that case, the ODT control signal input buffer 735 responds to an output signal of the data control signal input buffer 731 by being turned "off."

On the other hand, when the second memory device 706 is inactivated and the first memory device 704 is activated, the ODT control signal input buffer 725 receives the ODT control signal from the ODT control signal output buffer 724 of the first memory device 704 to control the ODT circuit 733 to be turned on. The ODT control signal input and output buffers 735 and 734 of the second memory device 706 are connected at a common node 736 that is coupled to the first memory device 704 via common a ball and pin (not shown).

In FIG. 7, the ODT control signals are transmitted via a single line between the nodes 726 and 736 so that just one pin is used for each memory device 704 and 706 (instead of two lines between the buffers 524, 525, 534, and 535 in FIG. 5). In addition, each of the ODT control signal input buffers 725 and 735 is turned off in response to a rank selection signal from the data control signal input buffers 721 and 731, respectively. Thus, a respective ODT control signal generated within an activated one of the memory devices 704 or 706 is prevented from turning on the respective ODT circuit 723 or 733.

In the present embodiment, the ODT control signal input buffers 725 and 735 and the ODT control signal output buffers 724 and 734 may be used in combination as an ODT control signal input/output buffer. Here, the selection of which of the ODT control signal input/output buffers 724, 735, 725, and 734 is turned on is determined by a rank selection signal which is one of the command signals (CMD) from the memory controller 702.

FIG. 7 illustrates an example of the first memory device 704 being selected to be activated for storing/reading data therein with the second memory device 706 being inactivated. In FIG. 7, components marked with thick lines are activated parts (i.e., turned on), and components marked with thin lines are inactivated (i.e., turned off).

The memory controller 702 outputs the command signals (CMD) to the first memory device 704 via the data control signal output buffer 712. The data control signal input buffer 721 of the first memory device 704 receives the command signals (CMD) and is activated. Then, the first memory device 704 is also activated for inputting/outputting data from/to the data input/output buffer 710 of the memory controller 702 via the data input/output buffer 720 of the first memory device 704. In addition, the ODT control signal input buffer 725 of the first memory device 704 is turned off in response to the rank selection signal from the data control signal input buffer 721.

Furthermore, the ODT control signal generator 722 interprets the command signals from the data control signal input buffer 721 to generate an ODT control signal. The ODT control signal output buffer 724 outputs the ODT control signal from the activated first memory device 704 to the ODT control signal input buffer 735 of the second memory device 706 via the common node 726 also connected to the ODT control signal input buffer 725. Here, because the ODT control signal input buffer 725 of the first memory device 704 is turned "off," the ODT control signal generated by the first memory device 704 is prevented from activating the ODT circuit 723 of the first memory device 704.

The ODT control signal input buffer 735 of the second memory device 706 receives the ODT control signal from the first memory device 704 that turns on the ODT circuit 733 of the second memory device 706 for on-die termination. In this manner, power consumption is minimized because just the ODT control signal input buffer 735 and the ODT circuit 733 of the second memory device 706 are turned on while the rest of the components of the second memory device 706 are turned off.

With the memory module system 700, on-die termination of other types of methods aside from just the other-on method may readily be performed. In addition, operation of the memory module system 700 for the case of the second memory device 706 being activated and the first memory device 704 being inactivated would be readily apparent to one of ordinary skill in the art from the description herein with the turning on or off of the components within the memory devices 704 and 706 being reversed.

Figure 8:
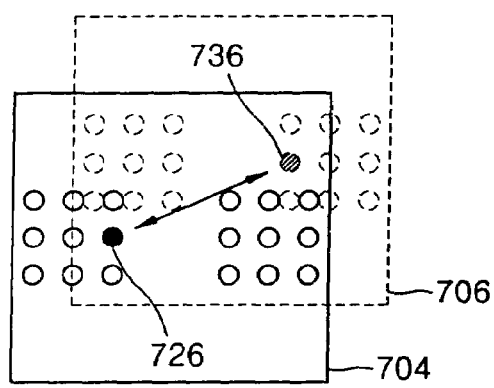
FIG. 8 shows an exemplary arrangement of contact balls of memory devices for the memory module system of FIG. 7, according to another embodiment of the present invention.

FIG. 8 shows an exemplary arrangement of contact balls of the memory devices 704 and 706 of the memory module system 700 of FIG. 7. FIG. 8 illustrates an example in which substrates of the first and second memory devices 704 and 706 face each other. Here, a contact ball 726 connected to the ODT control signal input and output buffers 725 and 724 of the first memory device 704 faces a contact ball 736 connected to the ODT control signal input and output buffers 735 and 734 of the second memory device 706.

In one embodiment of the present invention, such contact balls 726 and 736 for transmission of the ODT control signals are located at the center of each memory device for minimizing transmission distance between the memory devices 704 and 706. In turn, communication time and signal distortion between the memory devices 704 and 706 are minimized and circuitry for the input/output buffers 724, 725, 734, and 735 may be simplified.

Figure 9:
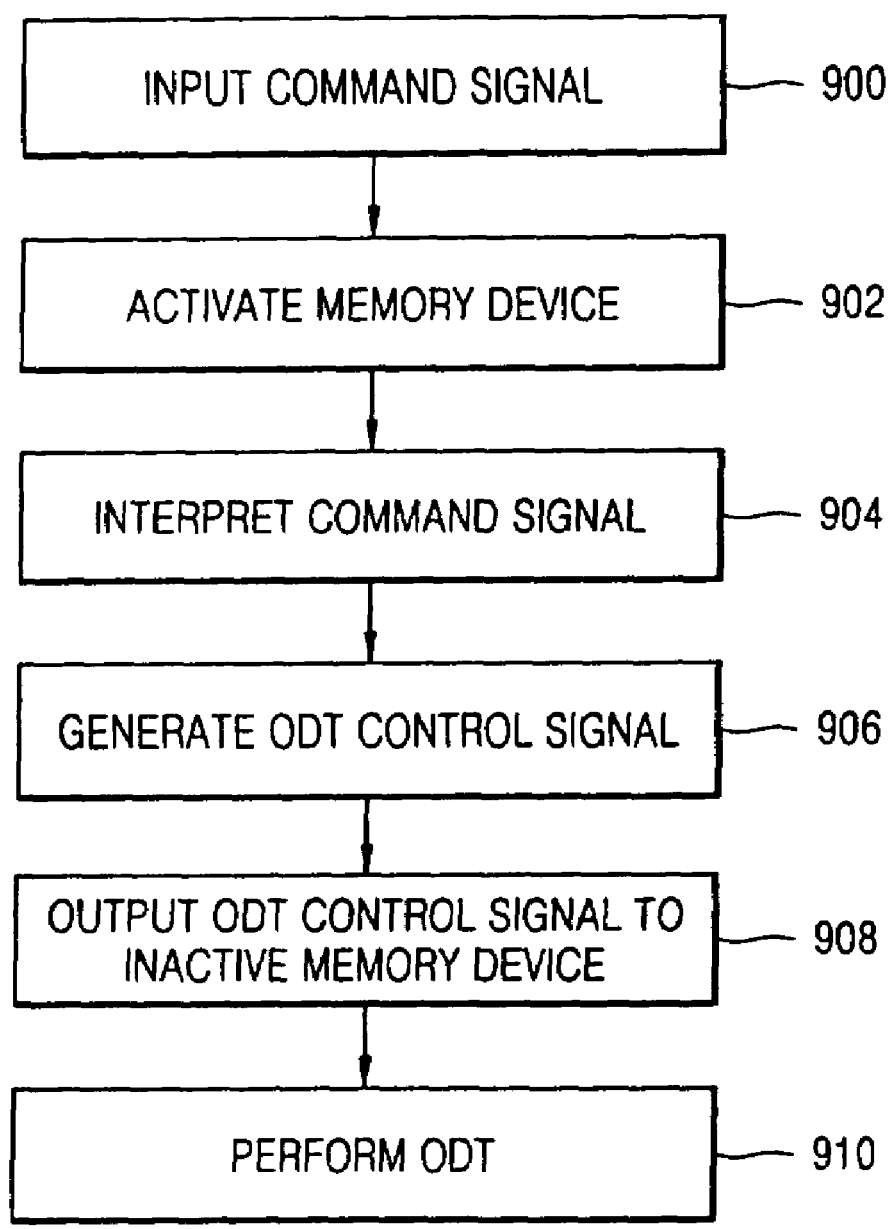
FIG. 9 shows a flowchart of steps for controlling ODT according to another embodiment of the present invention.

FIG. 9 is a flowchart illustrating a method of controlling ODT according to an embodiment of the present invention. Referring to FIG. 9, commands (CMD) are input by a memory device from a memory controller of a memory module system (step 900). Then, the memory device responds to the commands and is activated (step 902). The activated memory device interprets the commands (step 904) and generates an ODT control signal (step 906).

The generated ODT control signal is output to an inactivated memory device (step 908). Then, the inactivated memory device receives the ODT control signal and turns "on" an ODT circuit, thereby performing ODT (step 910).

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, the embodiments of FIGS. 5, 6, 7, and 8 illustrate a dual rank memory system. However, the present invention may also be practiced for memory modules with any number of ranks.

In addition, the embodiments of FIGS. 5, 6, 7, and 8 illustrate the first and second memory devices being for different ranks of a same memory module. Generally, a memory module is comprised of a plurality of memory devices with one set of memory devices comprising a first rank (rank0) disposed on one side of a circuit board, and a second set of memory devices comprising a second rank (rank1) disposed on another side of a circuit board.

Figure 10:
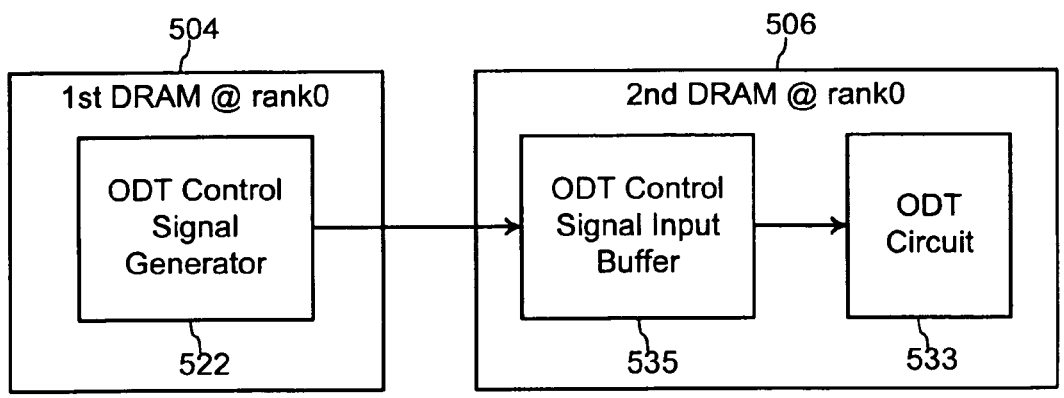
FIG. 10 shows a block diagram of a memory module system with a first memory device controlling ODT of a second memory device of a same rank, according to another embodiment of the present invention.
Figure 11:
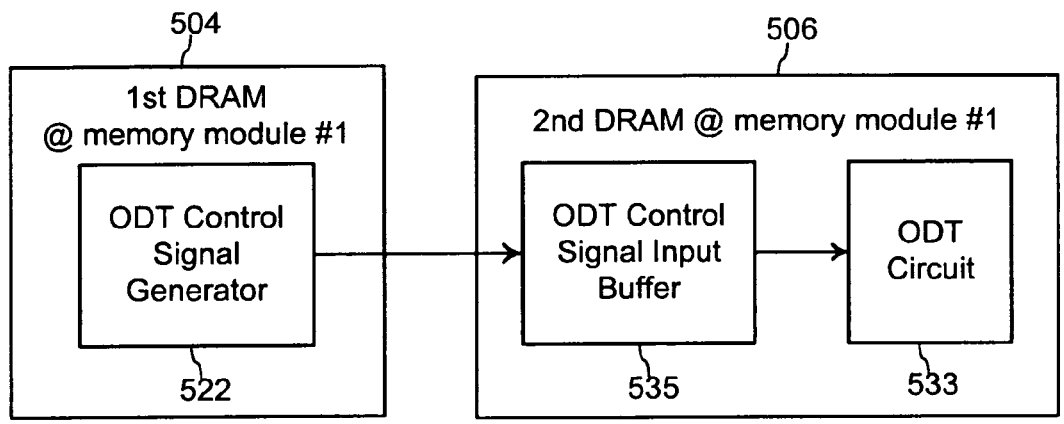
FIG. 11 shows a block diagram of a memory module system with a first memory device controlling ODT of a second memory device of a same memory module, according to another embodiment of the present invention.
Figure 12:
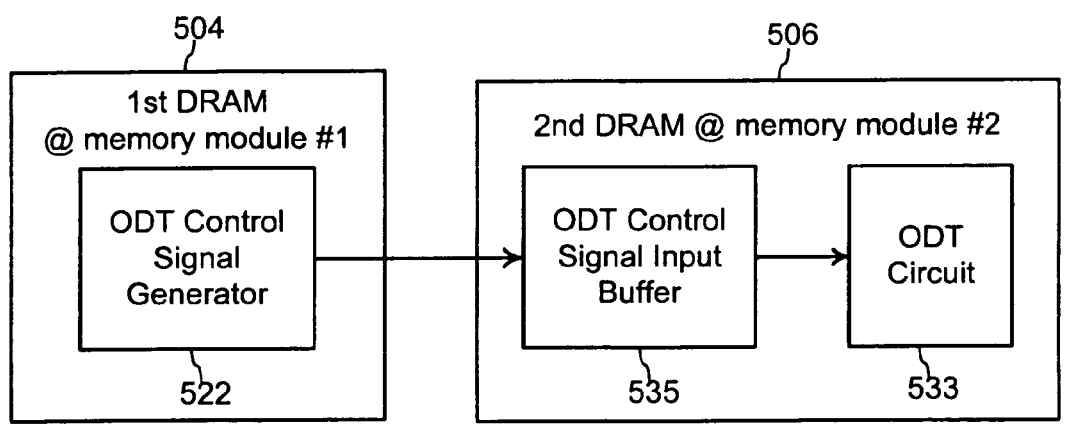
FIG. 12 shows a block diagram of a memory module system with a first memory device controlling ODT of a second memory device of a different memory module, according to another embodiment of the present invention.

The present invention may also be practiced when the first and second memory devices are disposed on a same rank (rank0) of a memory module, as illustrated in FIG. 10. Alternatively, the present invention may also be practiced when the first and second memory devices are disposed on a same memory module, as illustrated in FIG. 11. Moreover, the present invention may also be practiced when the first and second memory devices are disposed on different memory modules, as illustrated in FIG. 12.

In any case, the activated first memory device 504 includes the ODT control signal generator 522 that generates an ODT control signal sent to the inactivated second memory device 506. The ODT control signal input buffer 535 of the inactivated second memory device 506 receives the ODT control signal from the activated first memory device 504 to turn on the ODT circuit 533 within the inactivated second memory device 506.

The present invention is limited only as defined in the following claims and equivalents thereof.

What is claimed is:

1. A memory module system comprising:
   an on-die termination (ODT) control signal generator for generating an ODT control signal within a first memory device that is activated; and
   an ODT control signal receiver for controlling operation of an ODT circuit of a second memory device according to the ODT control signal from the first memory device;
   wherein the ODT control signal from the first memory device activates the ODT circuit of the second memory device when the second memory device is inactivated.

2. The memory module system of claim 1, wherein the first memory device is activated for storing/reading data therein.

3. The memory module system of claim 1, further comprising:
   a respective on-die termination (ODT) control signal generator for generating a respective ODT control signal within the second memory device; and
   a respective ODT control signal receiver for controlling operation of a respective ODT circuit of the first memory device according to the respective ODT control signal from the second memory device.

4. The memory module system of claim 3, wherein a respective ODT control signal generator corresponding to an inactivated one of the first and second memory devices is turned off.

5. The memory module system of claim 3, wherein a respective ODT control signal receiver corresponding to an activated one of the first and second memory devices is turned off.

6. The memory module system of claim 3, further comprising:
   a first ODT control signal output buffer that is turned on for sending a first ODT control signal from the first memory device that is activated to the second memory device that is inactivated; and
   a second ODT control signal output buffer that is turned on for sending a second ODT control signal from the second memory device that is activated to the first memory device that is inactivated.

7. The memory module system of claim 6, wherein one of the first and second ODT control signal output buffers corresponding to an inactivated one of the first and second memory devices is turned off.

8. The memory module system of claim 7, wherein the ODT control signal output buffers and the ODT control signal receivers are coupled together to a signal line between a first contact ball of the first memory device and a second contact ball of the second memory device with the contact balls facing each-other within the memory module system.

9. The memory module system of claim 6, wherein the ODT control signal output buffer of the first memory device and the ODT control signal receiver of the second memory device are coupled together to a first signal line, and wherein the ODT control signal output buffer of the second memory device and the ODT control signal receiver of the first memory device are coupled together to a second signal line.

10. The memory module system of claim 9, wherein each of the first and second signal lines is between a respective first contact ball of the first memory device and a respective second contact ball of the second memory device with the contact balls facing each-other within the memory module system.

11. The memory module system of claim 1, wherein the first and second memory devices are for a same rank of a memory module.

12. The memory module system of claim 1, wherein the first and second memory devices are for different ranks of a memory module.

13. The memory module system of claim 1, wherein the first and second memory devices are for different memory modules.

14. The memory module system of claim 1, further comprising:
   a plurality of other ODT control signal receivers for controlling operation of a plurality of other ODT circuits of a plurality of other inactivated memory devices according to the ODT control signal from the first memory device that is activated.

15. A memory module system comprising:
   an on-die termination (ODT) control signal generator for generating an ODT control signal within a first memory device;
   an ODT control signal receiver for controlling operation of an ODT circuit of a second memory device according to the ODT control signal from the first memory device; and
   a memory controller for generating command signals sent to the first and second memory devices;
   wherein the ODT control signal generator generates the ODT control signal from the command signals.

16. The memory module system of claim 15, further comprising:
   a first control signal input buffer within the first memory device that is turned on for receiving the command signals when the first memory device is activated; and
   a second control signal input buffer within the second memory device that is turned on for receiving the command signals when the second memory device is activated.

17. The memory module system of claim 16, wherein one of the first and second control signal input buffers corresponding to an inactivated one of the first and second memory devices is turned off.

18. A method of controlling ODT (on-die termination) within a memory module system, comprising:
   generating an ODT control signal within a first memory device that is activated; and
   controlling operation of an ODT circuit of a second memory device according to the ODT control signal from the first memory device,
   wherein the ODT control signal from the first memory device activates the ODT circuit of the second memory device when the second memory device is inactivated.

19. The method of claim 18, wherein the first memory device is activated for storing/reading data therein.

20. The method of claim 18, further comprising:
   turning on a respective control signal input buffer, a respective ODT control signal generator, and a respective ODT control signal output buffer and turning off a respective ODT control signal receiver, within one of the first and second memory devices that is activated for generating the ODT control signal therein; and turning off a respective control signal input buffer, a respective ODT control signal generator, and a respective ODT control signal output buffer and turning on a respective ODT control signal receiver, within one of the first and second memory devices that is inactivated for receiving the ODT control signal therein.

21. The method of claim 18, wherein the first and second memory devices are for a same rank of a memory module.

22. The method of claim 18, wherein the first and second memory devices are for different ranks of a memory module.

23. The method of claim 18, wherein the first and second memory devices are for different memory modules.

24. The method of claim 18, further comprising:
controlling operation of a plurality of other ODT circuits of a plurality of other inactivated memory devices according to the ODT control signal from the first memory device that is activated.

25. A method of controlling ODT (on-die termination) within a memory module system, comprising:

generating an ODT control signal within a first memory device that is activated;

controlling operation of an ODT circuit of a second memory device according to the ODT control signal from the first memory device;

generating and sending command signals from a memory controller to the first and second memory devices; and generating the ODT control signal within the first memory device from the command signals.

\* \* \* \* \*